United States Patent
Robinson

(10) Patent No.: US 6,437,586 B1
(45) Date of Patent: Aug. 20, 2002

(54) LOAD BOARD SOCKET ADAPTER AND INTERFACE METHOD

(75) Inventor: Keith Robinson, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/963,379

(22) Filed: Nov. 3, 1997

(51) Int. Cl.[7] .............................................. G01R 31/02
(52) U.S. Cl. ..................................................... 324/755
(58) Field of Search ................................ 324/754, 755, 324/757, 765, 758

(56) References Cited

U.S. PATENT DOCUMENTS

| | | | | |
|---|---|---|---|---|
| 4,145,620 A | * | 3/1979 | Dice ............................ | 307/149 |
| 4,922,191 A | * | 5/1990 | Conover ...................... | 324/755 |
| 5,387,861 A | * | 2/1995 | Neiderhofer .............. | 324/158.1 |
| 5,415,560 A | * | 5/1995 | Balyasny .................... | 439/269 |
| 5,594,356 A | * | 1/1997 | Turner et al. ................ | 324/755 |
| 5,847,572 A | * | 12/1998 | Iwasaki et al. ............. | 324/755 |
| 5,885,109 A | * | 3/1999 | Lee et al. .................... | 439/652 |

* cited by examiner

Primary Examiner—Michael J. Sherry
Assistant Examiner—Russell M. Kobert
(74) Attorney, Agent, or Firm—Perkins Coie LLP

(57) ABSTRACT

A load board adapter which is removably attachable to a load board and provides removable and replaceable sockets for individual integrated circuit packages to provide an electrical connection between the integrated circuits and the circuit tester to facilitate testing of relatively small quantities of electronic devices on high volume testers. The chip sockets can be configured to hold a variety of devices such as a DIP, an SOJ, a TSOP, a ZIF, a PLCC, etc. A first set of contacts are clamped to a main adapter base which is removably securable to a load board or similar test fixture. Each contact within the first set of contacts includes a load board engagement portion which is configured to frictionally engage pad sites on the test fixture. A second portion of each contact within the first set of contacts is configured to engage an individual contact within a second set of contacts. The second contacts are electrically connected to pin receptacles on a substrate such as a printed circuit board. The pin receptacles are arranged for removable reception of a socket.

19 Claims, 4 Drawing Sheets

LOAD BOARD SOCKET ADAPTER AND INTERFACE METHOD

BACKGROUND OF THE INVENTION

1. Technical Field

This invention generally relates to systems for testing electronic circuits by applying and/or measuring electrical signals. More particularly, this invention relates to electronic circuit test systems for applying electrical signals to a packaged device or integrated circuit being tested and measuring the response of the device or integrated circuit to the applied electrical signals. Specifically, one embodiment of the invention provides a replaceable socket for effecting an electrical connection in an electronic circuit tester between an electronic circuit, such as a packaged device or integrated circuit, and a fixture board of the tester so that electrical signals can be transmitted to and/or received from the electronic circuit for characterizing the performance of the electronic circuit.

2. Background Art

Programmable electronic circuit testers are used during the manufacture of integrated circuits to test the performance of the device. Tests are conducted to assure that the device satisfies performance specifications and to classify the devices by performance characteristics. In order to test the device or integrated circuit, the electronic circuit tester is programmed to apply one or more electrical signals to various pins or contacts on the device and to measure the response(s).

A conventional programmable electronic circuit tester, generally indicated by the numeral 10, is shown in FIG. 1. The electronic circuit tester 10 comprises a test head 12 electrically connected by cables routed through to electronic test and measurement instruments, such as advanced computerized signal processing equipment, for applying electrical signals and measuring the response(s) to those applied electrical signals. The test head 12 can include circuitry which performs distribution of electrical signals, signal separation, frequency translation, amplification, attenuation, switching, or other conditioning or modification of electrical signals prior to being routed to a device being tested.

As shown in FIG. 1, test head 12 interfaces to a device or integrated circuit through a load board 14 mounted to the test head. The configuration of the load board 14 depends on the type or family of device or integrated circuit being tested, such as an analog or digital electronic circuit.

A socket 20 through which an integrated circuit 22 is electrically connected to the electronic circuit tester 10 is subjected to many connections and disconnections during actual testing with the tester. However, the useful life of the electronic circuit tester 10 has heretofore far exceeded the useful life of socket 22. Also, the repeatability and accuracy of the connections that are effected by socket 20 with integrated circuit 22 decreases over time as the socket degrades due to wear. Additionally, because of the specialized nature of most limited run parts, a new interface or adapter must be installed for each part type to be tested.

A single load board for a particular testing application can cost as much as ten to twenty thousand dollars. Obviously, this expense is not justified for low quantity testing as is oftentimes necessary during the engineering and prototype and limited run production phases of most electronic devices. In these particular circumstances, tests have been done by hand which is extremely time consuming and oftentimes not as accurate.

What is needed is a flexible interface between integrated circuits and the circuit tester to facilitate testing of relatively small quantities of electronic devices on high volume testers.

DISCLOSURE OF THE INVENTION

One embodiment of the invention contemplates a load board adapter which is removably attachable to a load board and provides removable and replaceable sockets for individual integrated circuit packages to provide an electrical connection between the integrated circuits and the circuit tester. This particular embodiment of the invention utilizes a first set of contacts, one side of which interfaces with the load board or similar test fixture, and a second set of contacts interfacing with the first set of contacts. The second set of contacts are electrically connected to pin receptacles secured to a printed circuit board which receive a removable chip socket. The chip sockets can be configured to hold a variety of devices such as a dual in line package (DIP), a small outline J-leaded package (SOJ), a thin small outline package (TSOP), a zero insert force package (ZIF), a plastic leaded chip carrier (PLCC), etc. The first set of contacts are clamped to the main adapter base which is removably secured to the load board. Each contact within the first set of contacts includes a load board engagement portion which is configured to frictionally engage pad sites on the load board. A second portion of each contact within the first set of contacts is configured to engage an individual contact within the second set of contacts.

The second contacts are each electrically connected to separate pin receptacles on a substrate such as a printed circuit board. The pin receptacles are arranged for removable reception of a socket. The first set of contacts may be advantageously configured to force frictional engagement with their respective engagement elements via a spring biased arrangement, as will become evident in the following detailed description.

Employing the first and second contacts along with removable and replaceable sockets provides the flexibility of being able to not only replace damaged sockets with an identical new socket, but also allows entire socket and printed circuit board subassemblies to be changed on any particular adapter base and thereby accept different electrical components for testing using the same adapter base and load board.

DETAILED DESCRIPTION OF THE INVENTION

Figure 1:
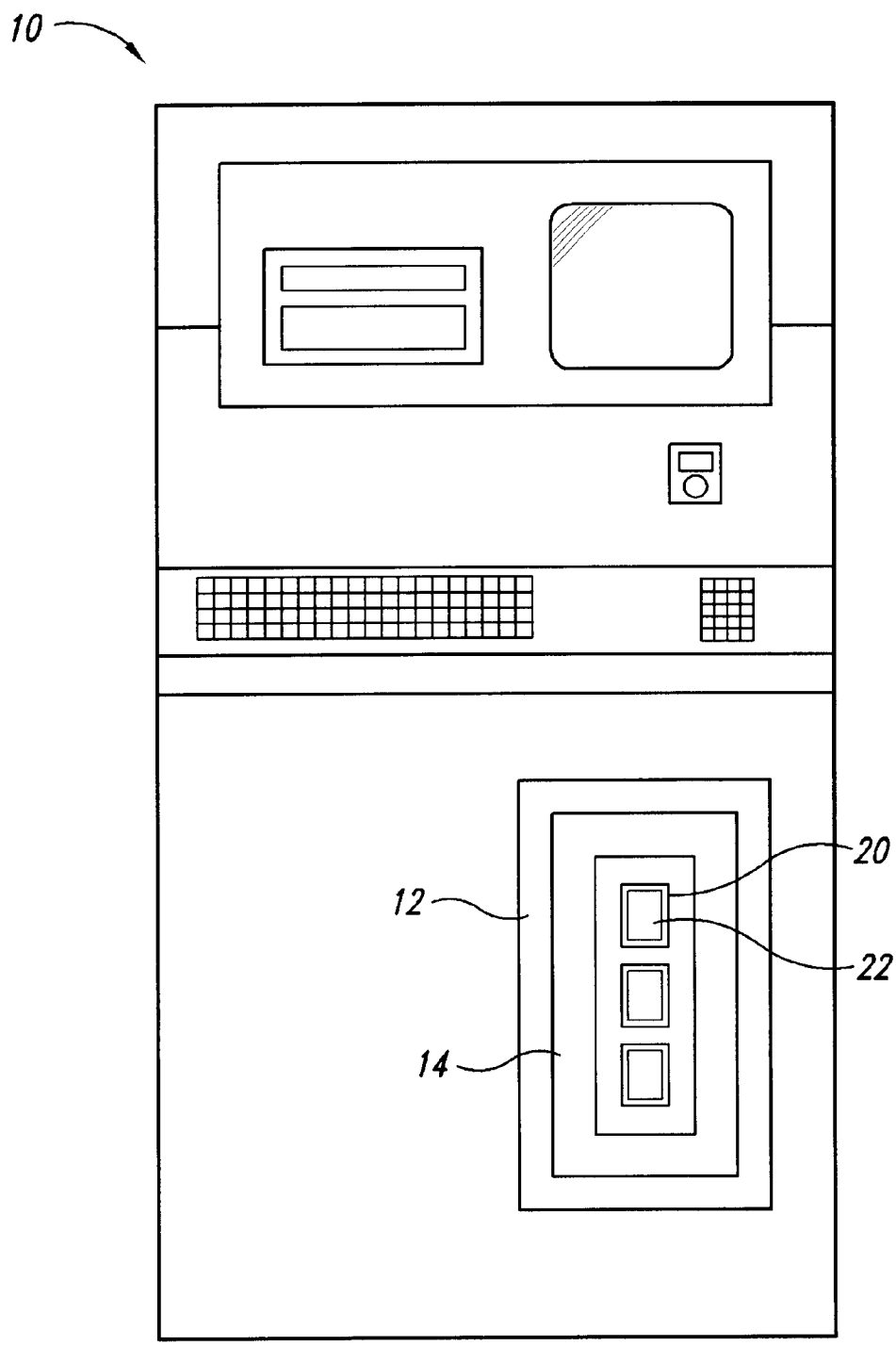
FIG. 1 is a representational view of an electronic circuit testing apparatus.
Figure 2:
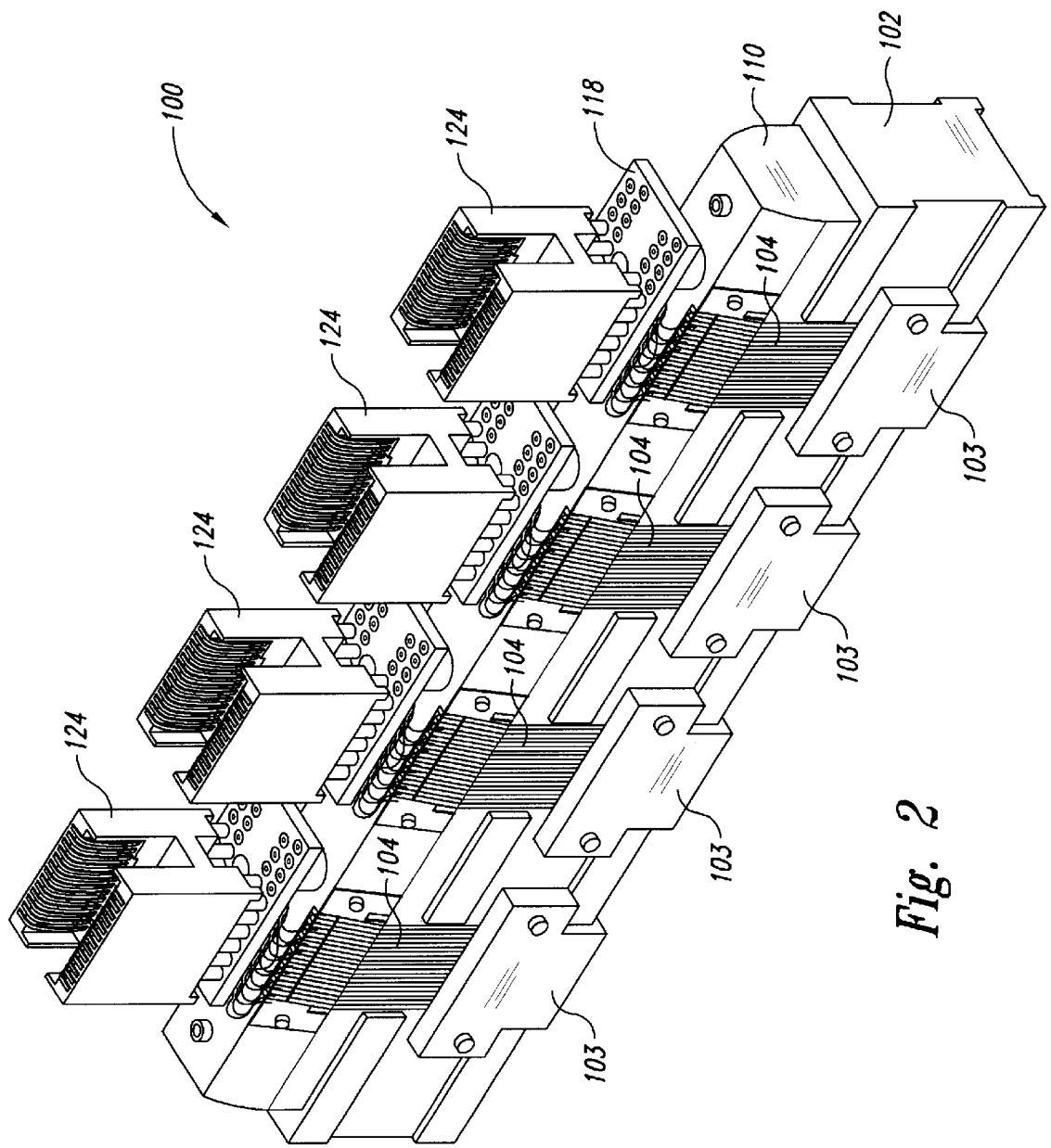
FIG. 2 is an isometric view of one embodiment of the load board socket adapter.
Figure 3:
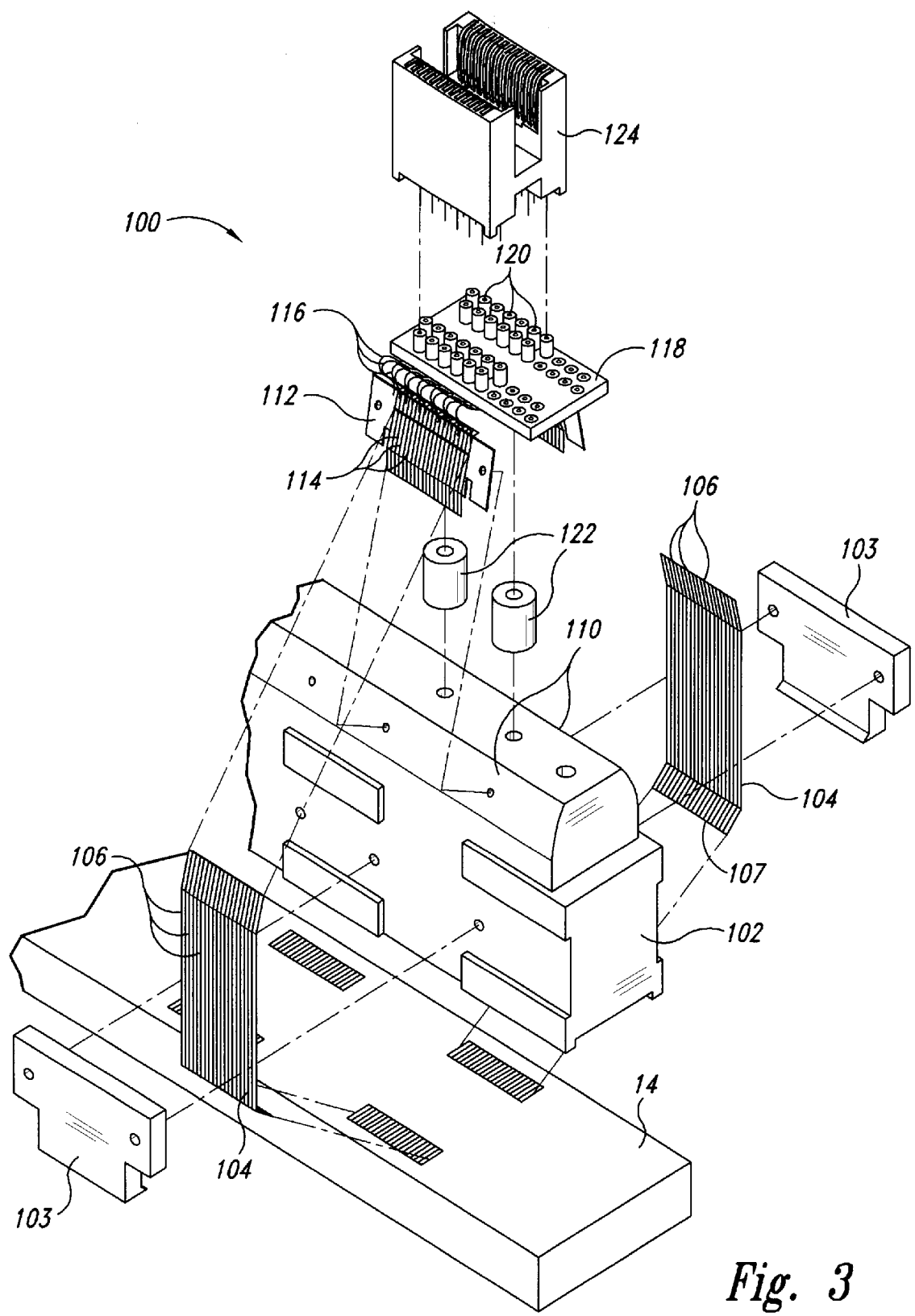
FIG. 3 is an exploded detail view of one embodiment of the load board socket adapter.
Figure 4:
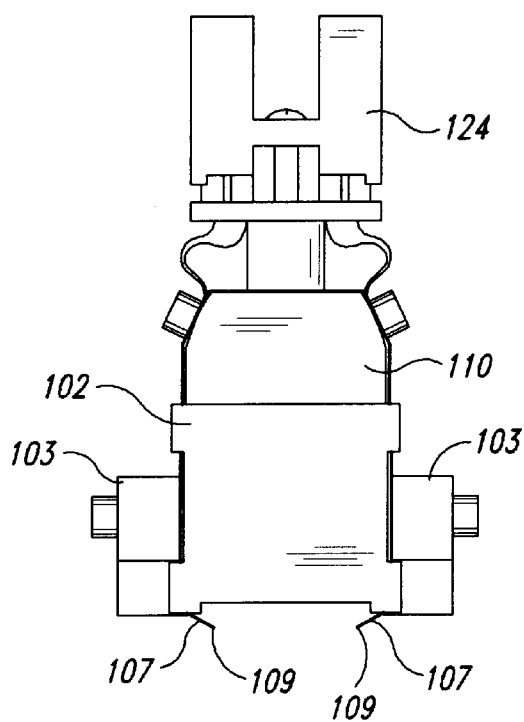
FIG. 4 is an end view of one embodiment of the load board socket adapter.
Figure 5:
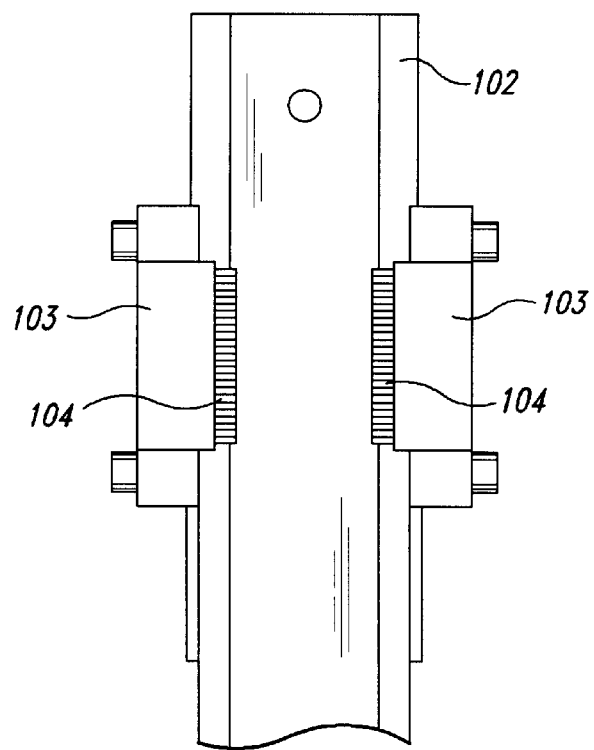
FIG. 5 is a bottom detail view of one embodiment of the load board socket adapter.

Referring in particular now to FIGS. 2–5, a load board socket adapter in accordance with the invention is shown and will be described in detail in the description which follows. The load board socket adapter is generally designated as 100 in the accompanying drawings.

Load board socket adapter 100 may have an adapter base 102 which advantageously can be manufactured from a phenolic material due to its electrical and machinability characteristics. It should be noted that other materials are suitable as well. The configuration of adapter base 102 can be adjusted or altered to attach to a variety of test fixtures. In the particular embodiment shown, the configuration is adapted to attach to both 4MX4 and 1MX4 load boards which allow a user to run tests for parts on a Megatest GII tester without the use of a corresponding handler.

A pair of first contact sets 104 are clamped or otherwise removably attached to opposing outside surfaces of adapter base 102. Here, first contact sets 104 are clamped to the sides of adapter base 102 using clamp members 103. Clamp members 103 may be attached to adapter base 102 using suitable screws or the like. First contact sets 104 may be constructed from a plurality of elongated resilient contacts 106, secured together in parallel spaced relation by an elastomeric or similar pliable material jacket. For most, if not all, applications it is desirable that each elongated resilient contact 106 be electrically isolated from all other electrical contacts 106 to ensure that each contact is capable of carrying an independent electrical signal. In the embodiment shown in the drawings, each electrical contact 106 includes a top angularly depending portion 108 and a bottom angularly depending portion 107. The angle of the top angularly depending portion 108 with respect to the main elongated body of each resilient contact 106 may be advantageously slightly more acute than the angle of the bezel portion 110 of adapter base 102. This feature provides that when first contact sets 104 are anchored to the sides of adapter base 102 a leaf spring action will ensure that the top angularly depending portions 108 contact the bezel surface of base bezel 110. The bottom angularly depending portions 107 of elongated resilient contacts 106 may depend angularly inward at an angle approaching 90°, but are shown here slightly more obtuse. Additionally, small flanges 109 may be formed at the distal ends of the bottom angularly depending portions 107. These flanges help ensure a point contact between elongated resilient contacts 106 and the contact portions or pads of load board 14.

A socket and printed circuit board subassembly is attached to the bezel portion 110 of adapter base 102 using a suitable removable attachment mechanism, such as screws or the like. The socket and printed circuit board subassembly here has a pair of second contact sets 112 electrically connected via wires 116 to a socket base or substrate 118, such as a printed circuit board, which in turn has pin receptacles 120 for receiving a removable socket such as removable socket 124. Socket base 118 may be secured to adapter base 102 via standoffs 122 as shown, using suitable connectors or fasteners. Here, each of the pair of second contact sets 112 are constructed from a plurality of individual contacts 114 secured together by an insulated material such as an elastomeric or similar material. Advantageously, second contact sets 112 can be sized and shaped to conform to the bezel portions of adapter base 102 or some similar surface, so long as the contacts are positioned to frictionally engage the top angularly depending portions 108 of first contact sets 104.

As is shown in the figures, several of the contact and socket assemblies may be attached to a single adapter base 102 and be positioned thereon to align with the contact sites on any particular test fixture such as load board 14. Additionally, the number of contacts can be varied as well as the shape of adapter base 102, the configurations of first contact sets 104, the configurations of second contact sets 112 and the type of sockets 124 can be varied as well.

While there are shown and described specific embodiments of the invention, it is to be distinctly understood that this invention is not limited thereto but may be variously embodied to practice within the scope of the following claims.

I claim:

1. An apparatus for interfacing a socket having pins to a testing apparatus comprising:
    a base member;
    a plurality of flexible first electrically conductive contacts being removably attachable to the base member, the first contacts having first portions configured to engage corresponding electrical contacts on the testing apparatus and second portions;
    a plurality of second contacts having first sections configured to frictionally engage the corresponding second portions of the first contacts; and
    a plurality of pin receptacles, each pin receptacle being electrically coupled to one of the second contacts, and the pin receptacles having openings configured to removably receive the pins in the socket.

2. The apparatus of claim 1 wherein the plurality of first contacts and the plurality of second contacts are each arranged in pairs of sets.

3. The apparatus of claim 2 wherein the first contacts are removably attachable to the base member by at least one clamp mechanism and the second contacts are removably attachable to a separate electrical connection with the socket.

4. The apparatus of claim 3 wherein connections between the first contacts and the second contacts are facilitated by the clamp mechanism.

5. The apparatus of claim 4 further comprising a socket base, the pin receptacles being carried by the socket base.

6. An apparatus for interfacing a socket to a testing apparatus comprising:
    a base member;
    a plurality of flexible first electrically conductive contacts being removably attachable to the base member, the first contacts having first portions configured to engage corresponding electrical contacts on the testing apparatus and second portions;
    a plurality of second contacts having first sections configured to frictionally engage corresponding second portions of the first contacts;
    a socket base adjacent to the second contacts; and
    a plurality of pin receptacles carried by the socket base, the pin receptacles being configured to removably engage the socket.

7. The apparatus of claim 6 wherein the plurality of first contacts and the plurality of second contacts are each arranged in pairs of sets.

8. The apparatus of claim 7 wherein the first contacts are removably attachable to the base member by at least one clamp mechanism and the second contacts are removably attachable to a separate electrical connection with the socket.

9. The apparatus of claim 8 wherein connections between the first contacts and the second contacts are facilitated by the clamp mechanism.

10. The apparatus of claim 6 wherein the socket base is attached to the base member.

11. The apparatus of claim 6 wherein the socket base is between the base and the pin receptacles.

12. An apparatus for interfacing a socket having pins to a testing apparatus having a load board, the interfacing apparatus comprising:
    a base member separate from the load board;

a socket base carried by the base member;

a plurality of flexible first electrically conductive contacts being removably attachable to the base member by at least one clamp mechanism, the first contacts having bottom portions configured to engage corresponding electrical contacts on the load board and top portions;

a plurality of second contacts having first sections configured to frictionally engage the top portions of the first contacts; and a plurality of pin receptacles carried by the socket base, each pin receptacle being electrically coupled to one of the second contacts, and each pin receptacle being configured to engage a pin of the socket.

13. The apparatus of claim 12 wherein the socket base is between the base and the pin receptacles.

14. An apparatus for interfacing a socket having pins to a testing apparatus having a load board, the interfacing apparatus comprising:

a base member separate from the load board;

a socket base carried by the base member;

a plurality of flexible first electrically conductive contacts, the first contacts having bottom portions configured to engage corresponding electrical contacts on the load board and top portions adapted to resiliently lie against a surface of the base member;

at least one clamp removably attached to the base member and clamping the first contacts against the base member;

a plurality of second contacts having first sections configured to frictionally engage the top portions of the first contacts; and a plurality of pin receptacles carried by the socket base, each pin receptacle being electrically coupled to one of the second contacts, and each pin receptacle being configured to removably physically engage a pin of the socket.

15. The apparatus of claim 14 wherein the a first set of the plurality of first contacts is clamped against a first surface of the base member and a second set of the plurality of first contacts is clamped against an opposing second surface of the base member.

16. The apparatus of claim 15 wherein the at least one clamp includes a first clamp which clamps the first set of first contacts against the first surface of the base member and a second clamp which clamps the second set of first contacts against the second surface of the base member.

17. The apparatus of claim 14 wherein the socket base is attached to the base member at a location spaced from the load board.

18. The apparatus of claim 14 wherein the base member is disposed between the socket base and the load board.

19. The apparatus of claim 14 wherein the each of the first contacts comprises an elongate resilient contact, the first set of first contacts further comprising a first pliable jacket.

\* \* \* \* \*

UNITED STATES PATENT AND TRADEMARK OFFICE
CERTIFICATE OF CORRECTION

PATENT NO.     : 6,437,586 B1                                           Page 1 of 1
DATED          : August 20, 2002
INVENTOR(S)    : Robinson It is certified that error appears in the above-identified patent and that said Letters Patent is hereby corrected as shown below:

<u>Column 5,</u>
Line 13, insert -- removably -- between "to" and "engage";

Signed and Sealed this

Sixth Day of May, 2003

JAMES E. ROGAN
*Director of the United States Patent and Trademark Office*